(12) United States Patent
Pu et al.

(10) Patent No.: US 11,733,766 B2
(45) Date of Patent: Aug. 22, 2023

(54) ULTRA-LOW POWER NEUROMORPHIC ARTIFICIAL INTELLIGENCE COMPUTING ACCELERATOR

(71) Applicant: QUALCOMM Incorporated, San Diego, CA (US)

(72) Inventors: Yu Pu, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/840,265

(22) Filed: Jun. 14, 2022

(65) Prior Publication Data

US 2022/0308653 A1 Sep. 29, 2022

Related U.S. Application Data

(62) Division of application No. 16/119,929, filed on Aug. 31, 2018, now Pat. No. 11,609,623.

(60) Provisional application No. 62/553,447, filed on Sep. 1, 2017.

(51) Int. Cl.
| | | |
|---|---|---|
| *G06F 1/32* | (2019.01) | |
| *G06F 1/3287* | (2019.01) | |
| *G06F 1/3234* | (2019.01) | |
| *G06F 1/3296* | (2019.01) | |
| *G06N 3/065* | (2023.01) | |
| *G06N 3/045* | (2023.01) | |

(52) U.S. Cl.
CPC .......... *G06F 1/3287* (2013.01); *G06F 1/3243* (2013.01); *G06F 1/3296* (2013.01); *G06N 3/045* (2023.01); *G06N 3/065* (2023.01)

(58) Field of Classification Search
CPC ..... G06F 1/3287; G06F 1/3296; G06N 3/045; G06N 3/065
See application file for complete search history.

(56) References Cited

U.S. PATENT DOCUMENTS

| | | |
|---|---|---|
| 8,510,244 B2 | 8/2013 | Carson et al. |
| 9,646,243 B1 | 5/2017 | Gokmen |
| 9,697,462 B1 | 7/2017 | Cruz-Albrecht et al. |
| 9,886,193 B2 | 2/2018 | Berger et al. |
| 9,928,460 B1 | 3/2018 | Nowatzyk et al. |
| 2003/0079150 A1 | 4/2003 | Smith et al. |
| 2010/0262757 A1 | 10/2010 | Sprinkle et al. |

(Continued)

FOREIGN PATENT DOCUMENTS

| | | |
|---|---|---|
| CN | 105892989 A | 8/2016 |
| CN | 106485317 A | 3/2017 |

(Continued)

OTHER PUBLICATIONS

International Search Report and Written Opinion—PCT/US2018/049287—ISA/EPO—dated Jan. 9, 2019.

(Continued)

*Primary Examiner* — Stefan Stoynov
(74) *Attorney, Agent, or Firm* — Seyfarth Shaw LLP

(57) ABSTRACT

A three-dimensional (3D) ultra-low power neuromorphic accelerator is described. The 3D ultra-low power neuromorphic accelerator includes a power manager as well as multiple tiers. The 3D ultra-low power neuromorphic accelerator also includes multiple cores defined on each tier and coupled to the power manager. Each core includes at least a processing element, a non-volatile memory, and a communications module.

3 Claims, 10 Drawing Sheets

(56) References Cited

U.S. PATENT DOCUMENTS

| | | | |
|---|---|---|---|
| 2011/0119322 A1 | 5/2011 | Li et al. | |
| 2012/0250443 A1* | 10/2012 | Saraswat | G06F 1/3275 365/226 |
| 2015/0032962 A1 | 1/2015 | Buyuktosunoglu | |
| 2015/0302295 A1 | 10/2015 | Rivera et al. | |
| 2017/0076197 A1 | 3/2017 | Alvarez-Icaza et al. | |
| 2017/0154257 A1 | 6/2017 | Cao et al. | |
| 2019/0073585 A1 | 3/2019 | Pu et al. | |

FOREIGN PATENT DOCUMENTS

| | | |
|---|---|---|
| CN | 106951961 A | 7/2017 |
| JP | 3699901 B2 | 9/2005 |
| TW | 201633193 A | 9/2016 |

OTHER PUBLICATIONS

Miermont S., et al., "A Power Supply Selector for Energy- and Area-Efficient Local Dynamic Voltage Scaling", Sep. 3, 2007 (Sep. 3, 2007), Ted Circuit and System Design, Power and Timing Modeling, Optimization and Simulation : 17th International Workshop, Patmos 2007, Gothenburg, Sweden, Sep. 3-5, 2007 ; Proceedings; [Lecture Notes in Computer Science], Springer, Berlin, Heidelber, XP019098355, pp. 556-565, ISBN 978-3-540-74441-2.

Taiwan Search Report—TW107130819—TIPO—dated May 5, 2022.

Vivet P., et al., "On Line Power Optimization of Data Flow Multi-Core Architecture Based on Vdd-Hopping for Local DVFS", Sep. 7, 2010 (Sep. 7, 2010), ICIAP: International Conference on Image Analysis and Processing, 17th International Conference, Naples, Italy, Sep. 9-13, 2013. Proceedings; [Lecture Notes in Computer Science; LECT.NOTES Computer], Springer, Berlin, Heidelberg, pp. 94-104, 2011, XP047441949, ISBN: 978-3-642-17318-9.

Rast A D., et al., "Virtual Synaptic Interconnect using an Asynchronous Network-On-Chip", Proceedings of The 2008 IEEE International Joint Conference On Neural Networks (IJCNN 108), Jun. 1, 2008, pp. 2727-2733; XP031327917, DOI: 18.1109/IJCNN.2008.4634181 sections II-IV.

* cited by examiner

ULTRA-LOW POWER NEUROMORPHIC ARTIFICIAL INTELLIGENCE COMPUTING ACCELERATOR

CROSS-REFERENCE TO RELATED APPLICATION

The present application is a divisional of U.S. patent application Ser. No. 16/119,929, filed Aug. 31, 2018, and titled "ULTRA-LOW POWER NEUROMORPHIC ARTIFICIAL INTELLIGENCE COMPUTING ACCELERATOR," and claims the benefit of U.S. Provisional Patent Application No. 62/553,447, filed on Sep. 1, 2017, and titled "ULTRA-LOW POWER NEUROMORPHIC ARTIFICIAL INTELLIGENCE COMPUTING ACCELERATOR," the disclosures of which are expressly incorporated by reference herein in their entireties.

BACKGROUND

Field

Certain aspects of the present disclosure generally relate to neuromorphic artificial intelligence (AI) computing and, more particularly, to systems and methods for enabling an ultra-low power neuromorphic artificial intelligence computing accelerator.

Background

An artificial neural network, which may be composed of an interconnected group of artificial neurons (e.g., neuron models), is a computational device or represents a method performed by a computational device. These neural networks may be used for various applications and/or devices, such as Internet Protocol (IP) cameras, Internet of Things (IoT) devices, autonomous vehicles, and/or service robots.

Convolutional neural networks are a type of feed-forward artificial neural network. Convolutional neural networks may include collections of neurons that each has a receptive field and that collectively tile an input space. Convolutional neural networks (CNNs) have numerous applications. In particular, CNNs have broadly been used in the area of pattern recognition and classification.

Deep learning architectures, such as deep belief networks and deep convolutional networks, are layered neural network architectures in which the output of a first layer of neurons becomes an input to a second layer of neurons, the output of a second layer of neurons becomes an input to a third layer of neurons, and so on. Deep neural networks may be trained to recognize a hierarchy of features and so they have increasingly been used in object recognition applications. Like convolutional neural networks, computation in these deep learning architectures may be distributed over a population of processing nodes, which may be configured in one or more computational chains. These multi-layered architectures may be trained one layer at a time and may be fine-tuned using backpropagation.

Devices with low resources, such as power, computing power, and/or battery life, may use an external device to perform training and/or classification. For example, an artificial neural network for a mobile device may be trained on a remote server and then deployed on the mobile device. Additionally, or alternatively, a mobile device may send collected data to a remote server for classification, such that the classification results would then be received at the mobile device.

Transmitting and receiving training and/or classification data poses security risks, increases network workload, and/or increases network bandwidth. Furthermore, in some cases, a device may not have access to a network. Therefore, it is desirable to provide an ultra-low power neuromorphic artificial intelligence computing accelerator, which may be used at an endpoint, such as a mobile device or a drone, for inference as well as training.

SUMMARY

A three-dimensional (3D) ultra-low power neuromorphic accelerator is described. The 3D ultra-low power neuromorphic accelerator includes a power manager as well as multiple tiers. The 3D ultra-low power neuromorphic accelerator also includes multiple cores defined on each tier and coupled to the power manager. Each core includes at least a processing element, a non-volatile memory, and a communications module.

A method of fabricating a three-dimensional (3D) ultra-low power neuromorphic accelerator is also described. The method includes fabricating a first tier of the 3D ultra-low power neuromorphic accelerator including at least a memory unit. The method also includes fabricating a second tier of the 3D ultra-low power neuromorphic accelerator including at least a communications module. The method further includes fabricating a third tier of the 3D ultra-low power neuromorphic accelerator including at least a processing element. The method includes stacking the second tier on the first tier and the third tier on the second tier to form the ultra-low power neuromorphic accelerator. The method further includes fabricating a power manager to adaptively scale a voltage of the ultra-low power neuromorphic accelerator.

A three-dimensional (3D) ultra-low power neuromorphic accelerator includes a communications and power management tier. The communications and power management tier includes communications modules and local power managers. The 3D ultra-low power neuromorphic accelerator also includes a memory tier including memory units. The 3D ultra-low power neuromorphic accelerator also includes a logic computation tier. The logic computation tier includes neural processing units. The logic computation tier is coupled to the communications and power management tier and the memory tier. In addition, each neural processing unit is coupled to one of the memory units and one of the local power managers.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1:
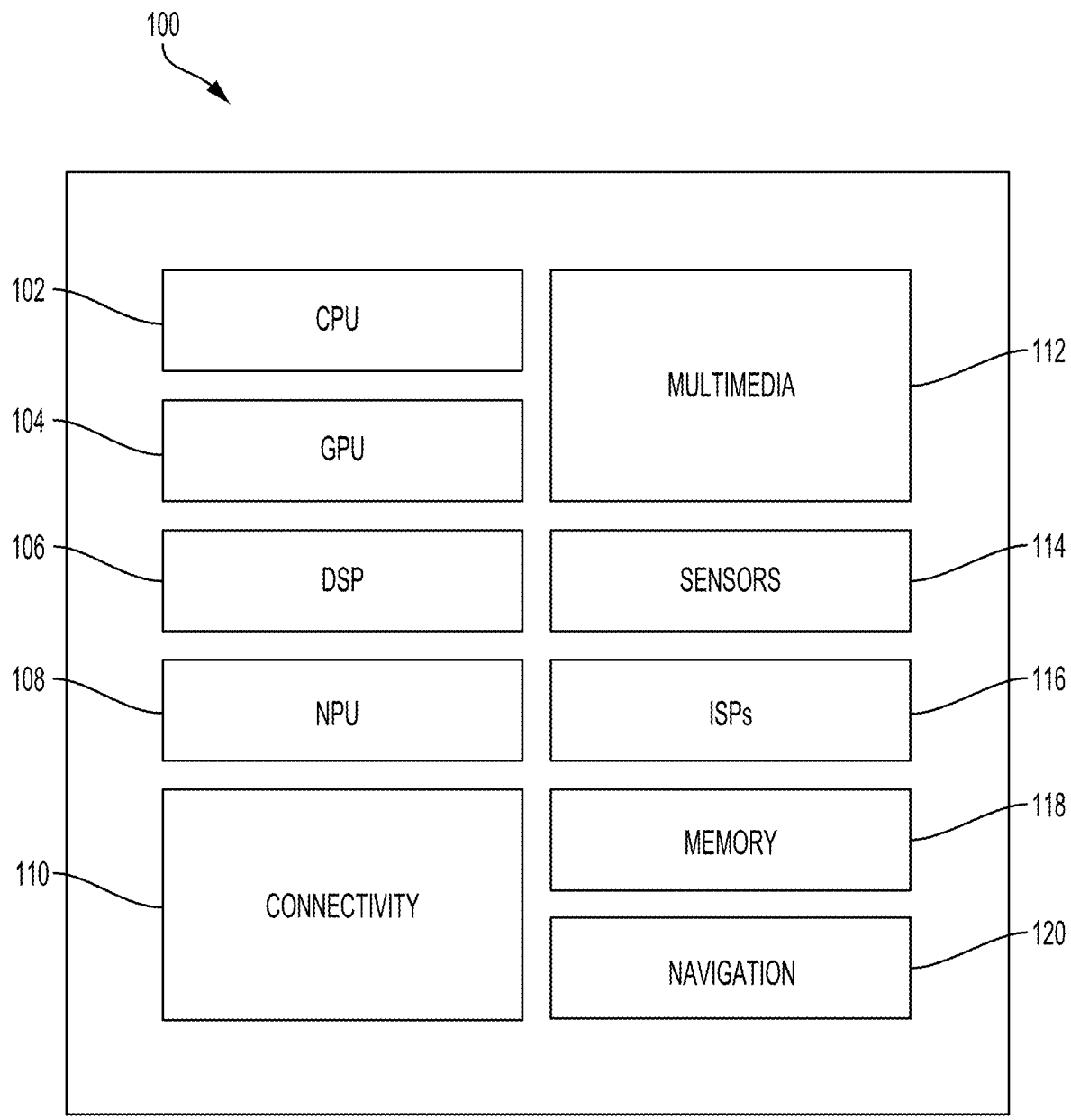
FIG. 1 illustrates an example implementation of designing a neural network using a system-on-chip (SOC), including an ultra-low power neuromorphic artificial intelligence computing accelerator in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Neuromorphic computing leverages the brain's strengths by using an architecture where neuromorphic circuits are modeled after neurons. Implementing neuromorphic architectures, however, is quite different from conventional computer networks, which rely on a global clock for synchronization. By contrast, the human brain is asynchronous because it does not rely on a global clock. It is also desirable to reduce the power consumption of neuromorphic circuits.

Aspects of the present disclosure are directed to a three-dimensional (3D) asynchronous network-on-chip (ANOC) for an edge-computing platform. In one configuration, the 3D ANOC includes a multi-tier (e.g., 1 to N tiers), multi-core ultra-low power neuromorphic accelerator. The multi-tier, multi-core ultra-low power neuromorphic accelerator may be referred to as a 3D ANOC accelerator. To reduce space and increase packing density, the tiers of the 3D ANOC accelerator are stacked. The 3D ANOC accelerator may be manufactured by stacking tiers composed of multiple silicon wafers and/or dies. The stacked dies may be interconnected vertically and horizontally using channels, such as vias, to function as a single device of the 3D ANOC accelerator. The 3D ANOC accelerator achieves performance improvements at reduced power within a smaller footprint than conventional two-dimensional (2D) processes.

Each tier may include multiple cores (e.g., integrated circuits). Each core includes a processing element (e.g., neuron), a memory (e.g., synapses), a local power manager (e.g., a power management integrated circuit (PMIC)), and a communications module. In one configuration, each core is locally synchronous and globally asynchronous. Based on a given task, multiple cores may be synchronized on demand.

Furthermore, the memory may be a hybrid memory. For example, the memory may be MRAM (magnetoresistive random access memory) and/or RRAM (resistive random access memory). In contrast to conventional memory, data in MRAM is not stored as an electric charge or a current flow. Rather, data in MRAM is stored by magnetic storage elements. The elements are formed from two ferromagnetic plates. Each ferromagnetic plate holds a magnetization, separated by an insulating layer. One of the two plates is a magnet set to a particular polarity. The other plate's magnetization can be changed to match that of an external field to store memory. RRAM is a type of non-volatile (NV) RAM that changes the resistance across a dielectric solid-state material (e.g., memristor). MRAM is desired in ultra-low power chips because MRAM exhibits reduced current leakage relative to conventional volatile memory (e.g., static random access memory (SRAM)).

In MRAM, one of the ferromagnetic layers may have a magnetization that is fixed in a particular direction, and is commonly referred to as the reference layer, which is interchangeably referred to as the fixed layer. The other ferromagnetic layer may have a magnetization direction that may be altered to represent either a "1" or a "0," and is commonly referred to as the free layer. For example, a "1" may be represented when the free layer magnetization is anti-parallel to the fixed layer magnetization. In addition, a "0" may be represented when the free layer magnetization is parallel to the fixed (reference) layer magnetization or vice versa. One such device having a fixed (reference) layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

FIG. 1 illustrates an example implementation of a system-on-chip (SOC) 100 of an ultra-low power neuromorphic artificial intelligence accelerator, which may include a single-core central processing unit (CPU) or a multi-core CPU in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a dedicated memory block 118, or may be distributed across multiple blocks. Instructions executed at the CPU 102 may be loaded from a program memory associated with the CPU 102 or may be loaded from a dedicated memory block 118.

The SOC 100 may also include additional processing blocks tailored to specific functions, such as a GPU 104, a DSP 106, a connectivity block 110, which may include fifth generation connectivity (5G), fourth generation long term evolution (4G LTE) connectivity, unlicensed Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs), and/or navigation 120, which may include a global positioning system. The SOC 100 may be based on an ARM instruction set.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
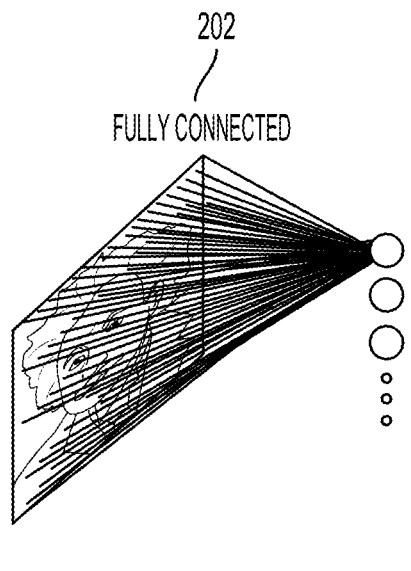
FIGS. 2A, 2B, and 2C are diagrams illustrating a neural network in accordance with aspects of the present disclosure.
Figure 2B:
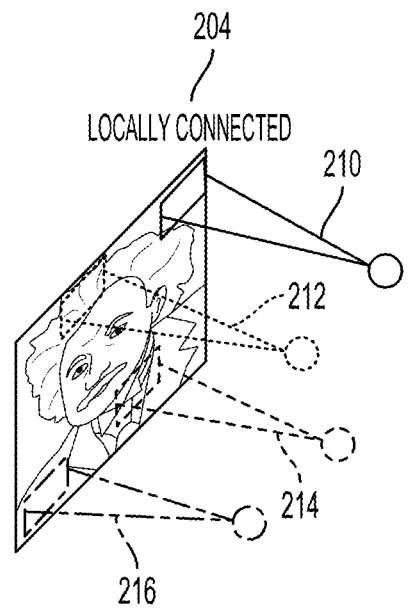

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
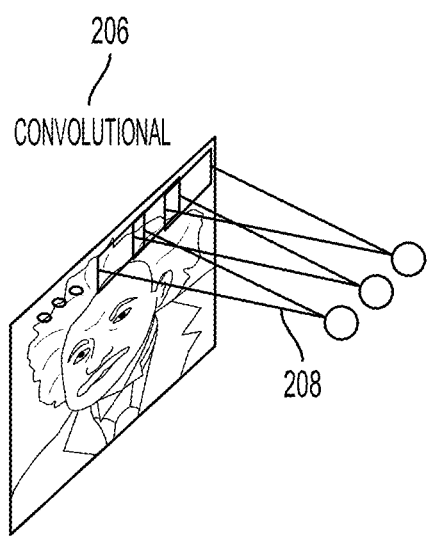

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful.

Figure 3:
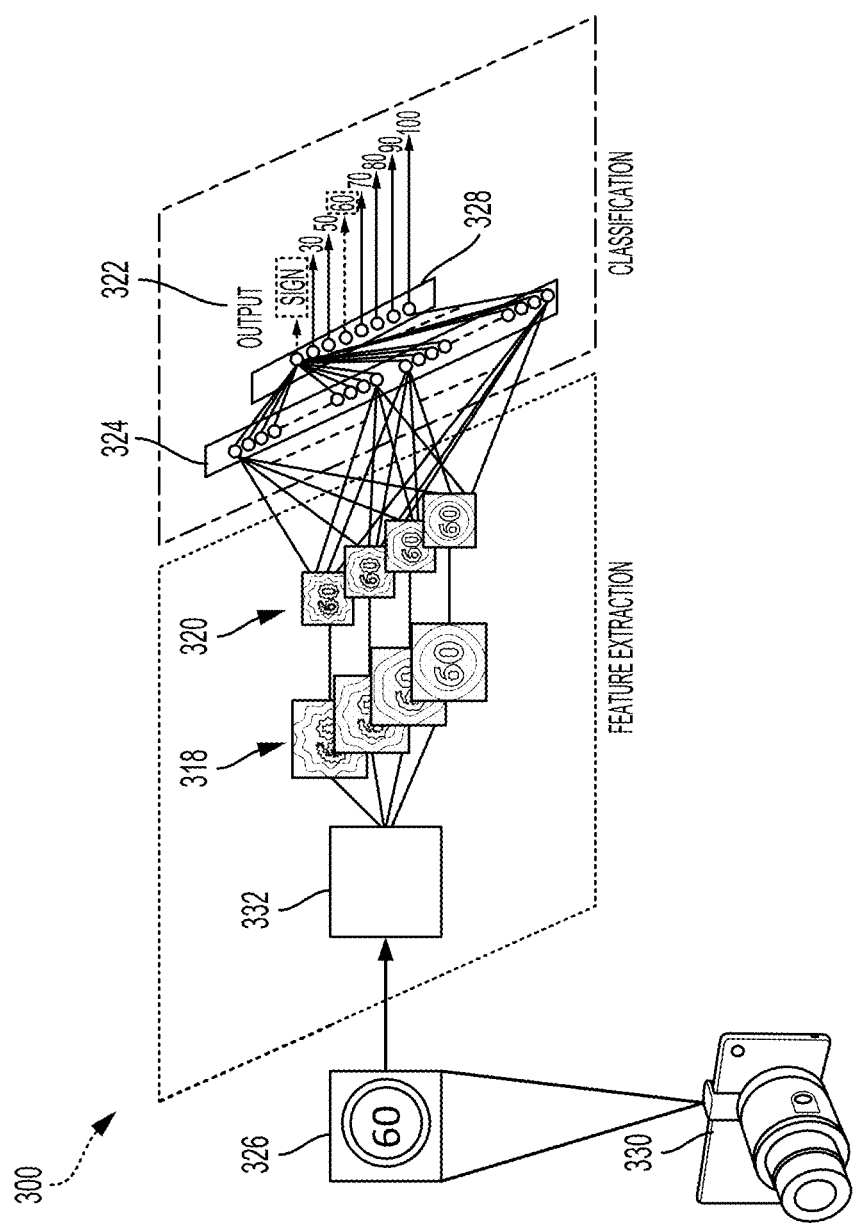
FIG. 3 is a diagram illustrating an exemplary deep convolutional network (DCN) in accordance with aspects of the present disclosure.

One type of convolutional neural network is a deep convolutional network (DCN). FIG. 3 illustrates a detailed example of a DCN 300 designed to recognize visual features from an image 326 input from an image capturing device 330, such as a car-mounted camera. The DCN 300 of the current example may be trained to identify traffic signs and a number provided on the traffic sign. Of course, the DCN 300 may be trained for other tasks, such as identifying lane markings or identifying traffic lights.

The DCN 300 may be trained with supervised learning. During training, the DCN 300 may be presented with an image, such as the image 326 of a speed limit sign, and a forward pass may then be computed to produce an output 322. The DCN 300 may include a feature extraction section and a classification section. Upon receiving the image 326, a convolutional layer 332 may apply convolutional kernels (not shown) to the image 326 to generate a first set of feature maps 318. As an example, the convolutional kernel for the convolutional layer 332 may be a 5×5 kernel that generates 28×28 feature maps. In the present example, because four different feature maps are generated in the first set of feature maps 318, four different convolutional kernels were applied to the image 326 at the convolutional layer 332. The convolutional kernels may also be referred to as filters or convolutional filters.

The first set of feature maps 318 may be subsampled by a max pooling layer (not shown) to generate a second set of feature maps 320. The max pooling layer reduces the size of the first set of feature maps 318. That is, a size of the second set of feature maps 320, such as 14×14, is less than the size of the first set of feature maps 318, such as 28×28. The reduced size provides similar information to a subsequent layer while reducing memory consumption. The second set of feature maps 320 may be further convolved via one or more subsequent convolutional layers (not shown) to generate one or more subsequent sets of feature maps (not shown).

In the example of FIG. 3, the second set of feature maps 320 is convolved to generate a first feature vector 324. Furthermore, the first feature vector 324 is further convolved to generate a second feature vector 328. Each feature of the second feature vector 328 may include a number that corresponds to a possible feature of the image 326, such as "sign," "60," and "100." A softmax function (not shown) may convert the numbers in the second feature vector 328 to a probability. As such, an output 322 of the DCN 300 is a probability of the image 326 including one or more features.

In the present example, the probabilities in the output 322 for "sign" and "60" are higher than the probabilities of the others of the output 322, such as "30," "40," "50," "70," "80," "90," and "100." Before training, the output 322 produced by the DCN 200 is likely to be incorrect. Thus, an error may be calculated between the output 322 and a target output. The target output is the ground truth of the image 326 (e.g., "sign" and "60"). The weights of the DCN 300 may then be adjusted so the output 322 of the DCN 300 is more closely aligned with the target output.

To adjust the weights, a learning algorithm may compute a gradient vector for the weights. The gradient may indicate an amount that an error would increase or decrease if the weight were adjusted slightly. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted so as to reduce the error. This manner of adjusting the weights may be referred to as "backpropagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level.

After learning, the DCN may be presented with new images (e.g., 326) and a forward pass through the network may yield an output 322 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional (3D), with two spatial dimensions along the axes of the image and a third dimension capturing color information. The outputs of the convolutional connections may be considered to form a feature map in subsequent layers, with each element of the feature map (e.g., 320) receiving input from a range of neurons in the previous layer (e.g., 318) and from each of the multiple channels. The values in the feature map may be further processed with a non-linearity, such as a rectification, max (0,x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 4:
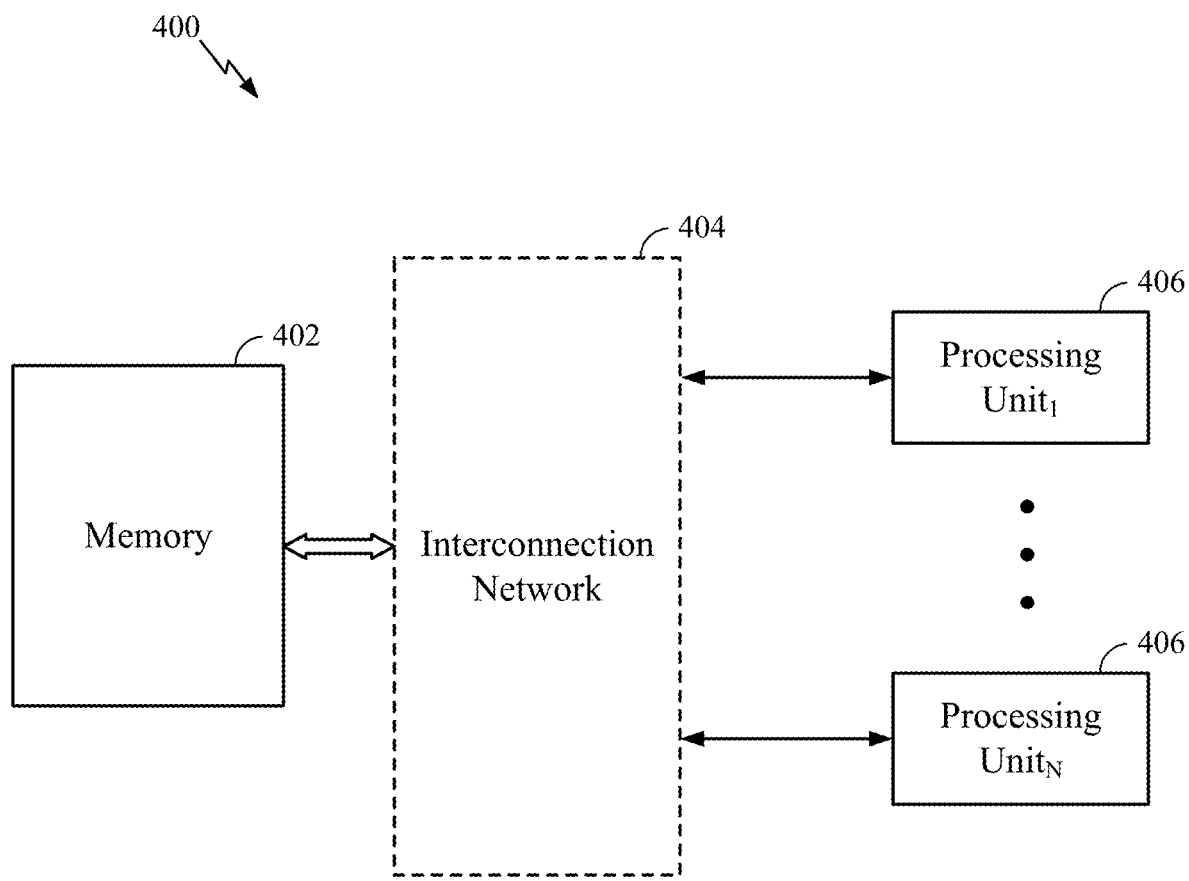
FIG. 4 illustrates an example implementation of designing a neural network where a memory may be interfaced with individual distributed processing units.

FIG. 4 illustrates an example implementation 400 of a conventional neural processor where a memory 402 can be interfaced via an interconnection network 404 with individual (distributed) processing units (neural processors) 406 of a computational network (neural network) in accordance with certain aspects of the present disclosure. Variables (neural signals), synaptic weights, system parameters associated with the computational network (neural network) delays, frequency bin information, relative activation, and/or connection imbalance, may be stored in the memory 402, and may be loaded from the memory 402 via connection(s) of the interconnection network 404 into each processing unit (neural processor) 406.

Figure 5:
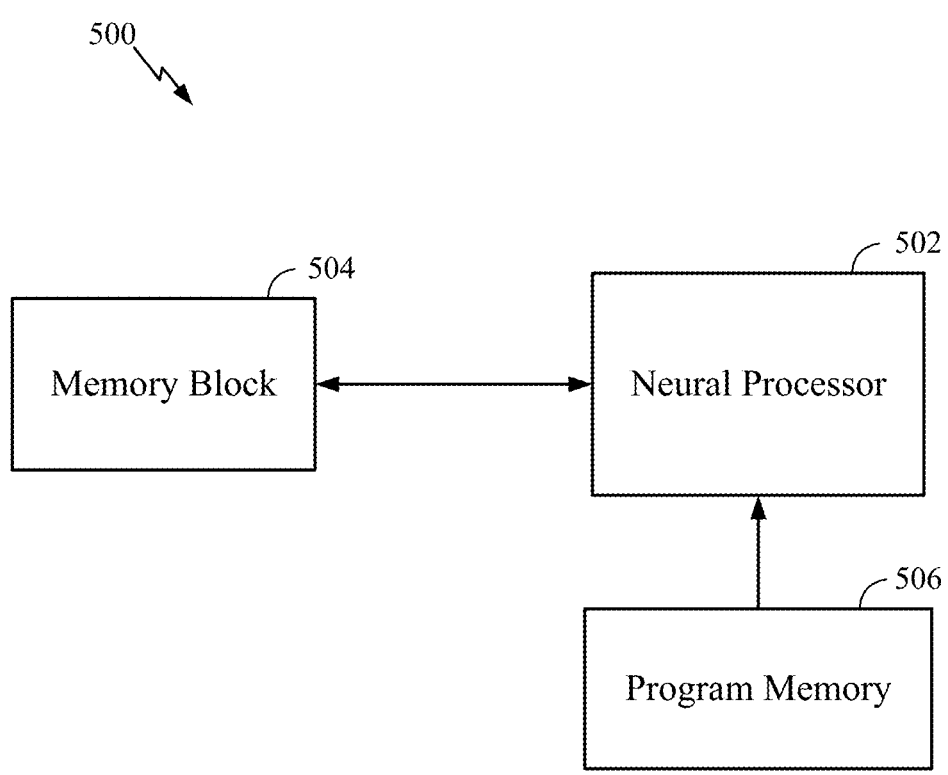
FIG. 5 illustrates an example implementation of designing a neural network using a neural processor, including an ultra-low power neuromorphic artificial intelligence computing accelerator, in accordance with certain aspects of the present disclosure.

FIG. 5 illustrates an example implementation 500 of a core of an ultra-low power neuromorphic artificial intelligence accelerator using a neural processor 502, in accordance with certain aspects of the present disclosure. Variables (neural signals), synaptic weights, system parameters associated with a computational network (neural network), delays, and frequency bin information may be stored in a memory block 504, while instructions executed at the neural processor 502 may be loaded from a program memory 506. The program memory 506 and memory block 504 may be distinct units or the same unit.

Figure 6:
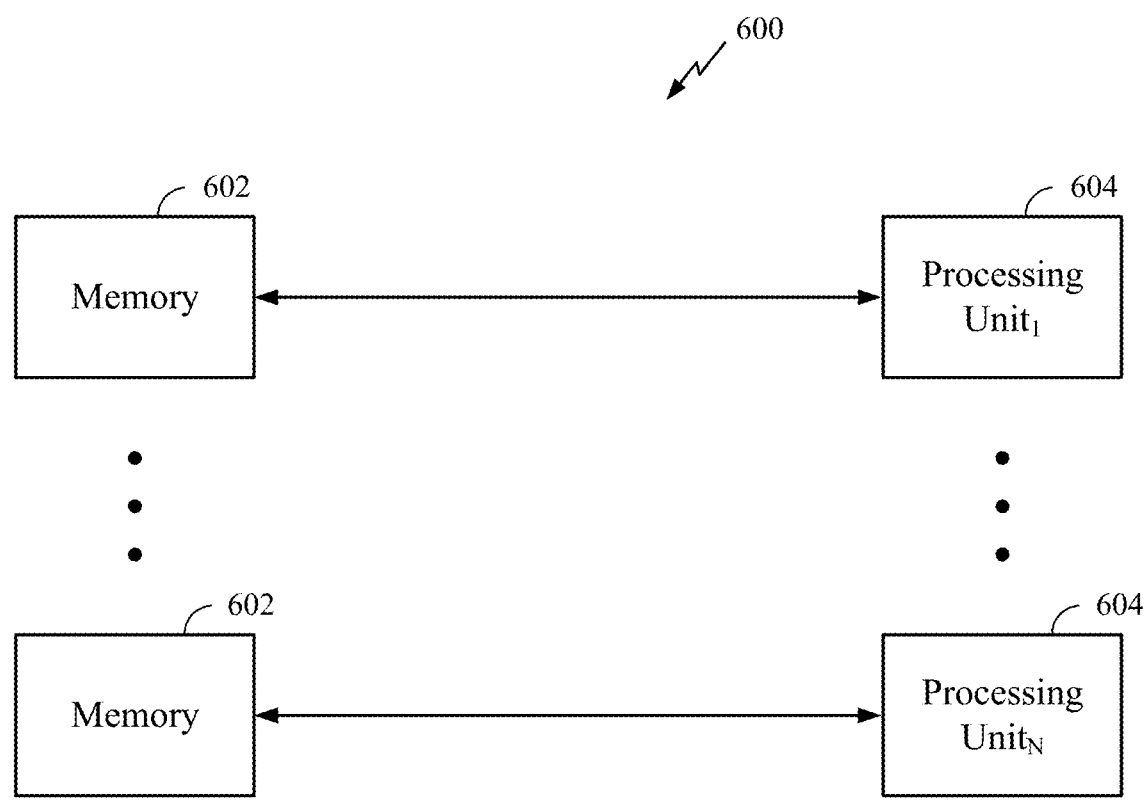
FIG. 6 illustrates an example implementation of an ultra-low power neuromorphic artificial intelligence accelerator with multiple cores, in accordance with certain aspects of the present disclosure.

FIG. 6 illustrates an example implementation 600 of an ultra-low power neuromorphic artificial intelligence accelerator with multiple cores. As illustrated in FIG. 6, a memory bank 602 may be directly interfaced with a processing unit 604 of a computational network (neural network). Each memory bank 602 may store variables (neural signals), synaptic weights, and/or system parameters associated with a corresponding processing unit (neural processor) 604 delays, frequency bin information, relative activation, and/or connection imbalance.

Figure 7:
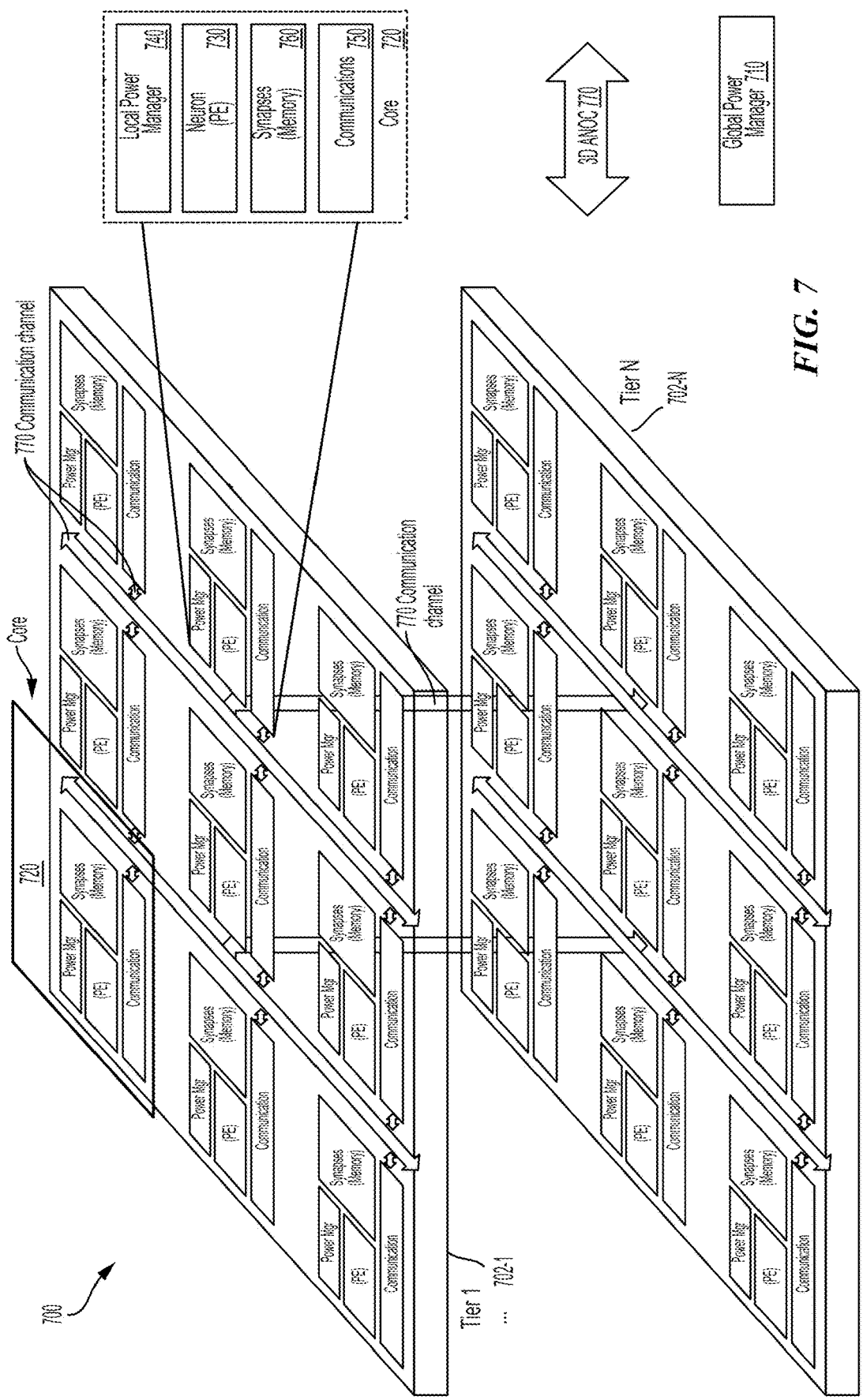
FIG. 7 is a block diagram illustrating a three-dimensional (3D) asynchronous network-on-chip (ANOC) including a multi-tier, multi-core ultra-low power neuromorphic accelerator, in accordance with certain aspects of the present disclosure.

FIG. 7 is a block diagram illustrating a three-dimensional (3D) asynchronous network-on-chip (ANOC) including a multi-tier, multi-core ultra-low power neuromorphic accelerator, in accordance with certain aspects of the present disclosure. A 3D ANOC accelerator 700 includes multiple tiers 702 (702-1, . . . , 702-N) in a homogeneous configuration that are stacked to reduce space consumption. In this homogeneous configuration, each of the multiple tiers 702 includes multiple cores 720. For example, each of the multiple cores 720 includes a processing element (PE) 730 (e.g., a neuron), a local power manager 740 (e.g., power management integrated circuit (PMIC)), a communications module 750, and a memory 760 (e.g., synapses).

A human brain does not include a clock, therefore, aspects of the present disclosure are directed to asynchronous communications. That is, in one configuration, a neuromorphic accelerator is implemented as a 3D asynchronous network-on-chip (ANOC), which may be referred to herein as a 3D ANOC accelerator. This configuration of the 3D ANOC accelerator seeks to bridge the gap between conventional neuromorphic processors and the human brain. The human brain is composed of approximately 100 trillion synapses and uses approximately 20 watts (W) of total power. As such, there is approximately a 1000 time energy gap between conventional neuromorphic processors and the human brain.

As shown in FIG. 7, aspects of the present disclosure are directed to an ultra-low power neuromorphic accelerator for an edge-computing platform. To bridge the gap between the human brain and conventional neuromorphic processors, the 3D ANOC accelerator 700 may be configured with sub-threshold voltage cores (e.g., ~0.2 volts (V)). For example, the multiple cores 720 may be fabricated by selecting an ultra-low voltage friendly process such as, for example, fully depleted silicon-on-insulator (FD-SOI) or other like ultra-low voltage process. In addition, the multiple cores 720 may be configured to perform adaptive voltage scaling to sub-threshold voltage (e.g., 0.2 V to 0.25 V). In addition, transistors within the multiple cores 720 may be replaced with nano-sized mechanical switches (e.g., micro-electro-mechanical systems (MEMS) switches).

In the configuration shown in FIG. 7, the memory 760 may be implemented using non-volatile (NV) memory, such as MRAM (magnetoresistive random access memory) to further approximate the human brain. MRAM is desired in ultra-low power chips because MRAM exhibits reduced current leakage relative to conventional volatile memory (e.g., static random access memory (SRAM)). Resistive random access memory (RRAM) is a type of non-volatile (NV) RAM that changes the resistance across a dielectric solid-state material (e.g., memristor). RRAM may also exhibit similar reduced current leakage for implementing the memory 760. Phase change memory (PCM) may also be used to implement the memory 760. In this configuration, the memory 760 includes multiple synapses, such as 256 synapses. PCM, MRAM and RRAM are examples of non-volatile memory that exhibit close to zero leakage. MRAM, however, outperforms PCM and RRAM memory in endurance (e.g., write cycles) and speed (e.g., read/write latency).

According to aspects of the present disclosure, the multiple cores 720 each include a clock, such that the synapses of the multiple cores 720 are locally synchronized. That is, the 3D ANOC accelerator 700 may be globally asynchronous and locally synchronous. A globally asynchronous communications configuration avoids a global clock that is common to conventional synchronous designs. Although the multiple cores 720 are asynchronous relative to each other, each core itself can be synchronous or asynchronous. In one configuration, the multiple cores 720 may be synchronized as necessary. In addition, the communications module 750 may be used to communicate with the multiple cores 720 across the same or a different layer. A communications channel 770 between the multiple cores 720 can be a crossbar (X-bar) implementation using, for example, fiber optics. Other examples for implementing the communications channel 770 include very high bandwidth inter-die links and physical layer (PHY) bridges. Direct vertical vias may also be used to implement the communications channel 770 if the 3D die-to-die processing can provide high-density fine-grain links.

Figure 8:
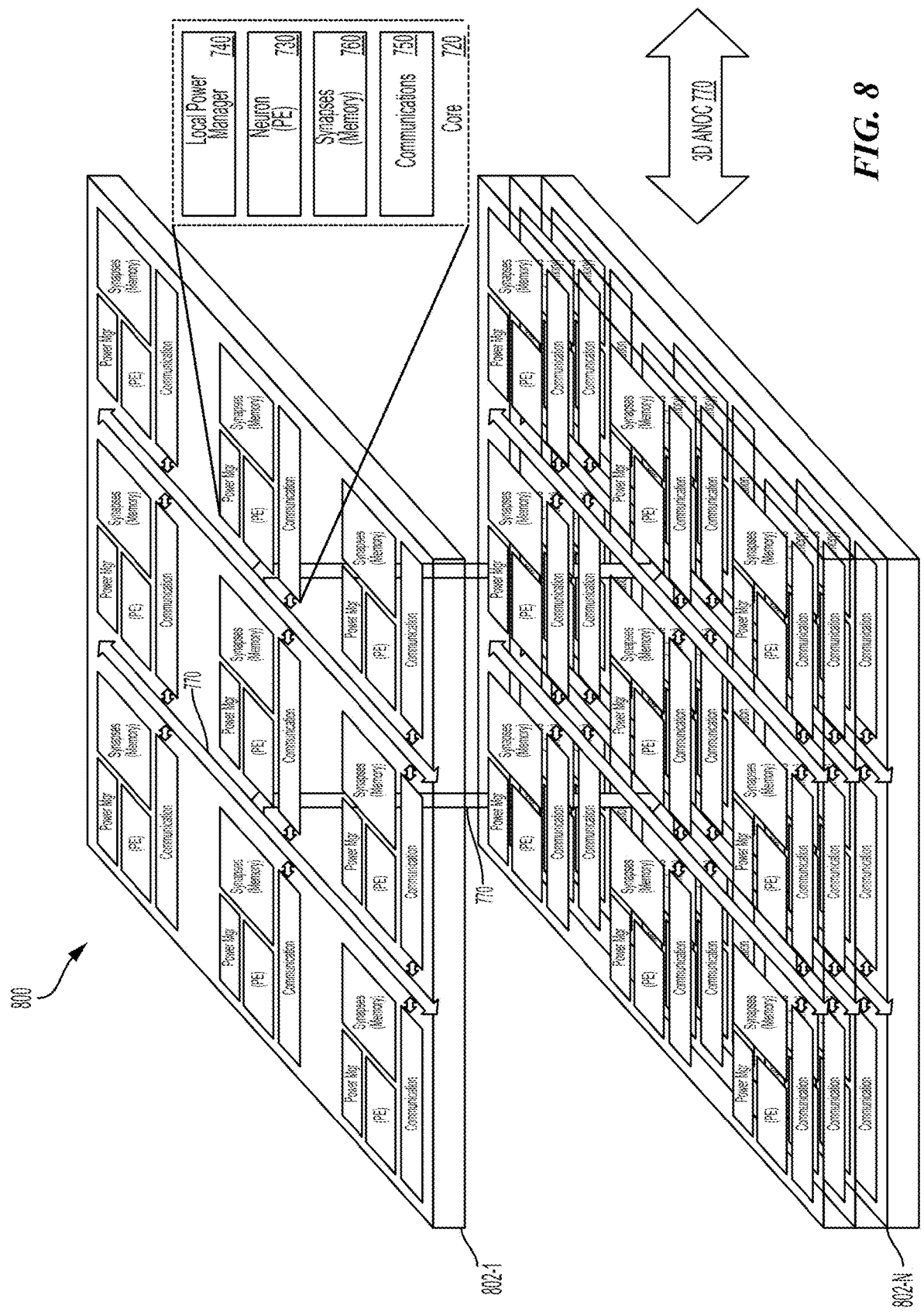
FIG. 8 is a block diagram illustrating a homogenous configuration of a three-dimensional (3D) asynchronous network-on-chip (ANOC) including a multi-tier, multi-core ultra-low power neuromorphic accelerator, in accordance with certain aspects of the present disclosure.

FIG. 8 is a block diagram illustrating a homogenous configuration of a three-dimensional (3D) asynchronous network-on-chip (ANOC) including a multi-tier, multi-core ultra-low power neuromorphic accelerator, in accordance with certain aspects of the present disclosure. A 3D ANOC accelerator 800 is shown in a homogenous configuration, in which each of the tiers 802 (802-1, . . . , 802-N) includes the same configuration of the multiple cores 720 shown in FIG. 7. This homogenous configuration improves system scalability and re-configurability because new cores (e.g., 720) and/or tiers (e.g., 802) do not have to integrate with a global clock due to asynchronous operation. The homogeneous configuration reduces interconnection power, while removing restrictions on a number of fan-ins/fan-outs for each synapse (e.g., memory 760) and neuron (e.g., processing element (PE) 730).

The homogenous configuration may be implemented in the local power manager 740 using a power management integrated circuit (PMIC). In this configuration, the local power manager may be fabricated using an ultra-low voltage process, such as a fully depleted (FD)-semiconductor-on-insulator (FD-SOI) wafer process, or other ultra-low voltage process. The local power manager 740 may be configured to perform snoops on adjacent cores using, for example, handshaking circuitry to communicate core-to-core to decide the power state of a corresponding core.

In one aspect of the present disclosure, the local power manager 740 may be configured to provide adaptive voltage scaling to enable sub-threshold voltage (e.g., 0.2 V to 0.25 V) operation. In this configuration, smart power management is provided by including a global power manager (GPM) 710 to coordinate with each local power manager 740 to provide dynamic voltage frequency scaling (DVFS) and power collapse control for each tier 702. In aspects of the present disclosure, the GPM 710 (shown off-chip) can be either on-chip or off-chip. In this example, the GPM 710 delivers power to a set of cores (e.g., the cores on one tier or multiple tiers), whereas the local power manager 740 derives power for each individual core.

In aspects of the present disclosure, power collapse control for the tiers 802 may be controlled using a probabilistic turning machine to trade-off between error tolerance and power, for approximate computing. That is, based on the specificity/precision of a task, cores may be turned on/off. For example, when an approximate decision is specified, the 3D ANOC accelerator 800 may operate with a reduced number of cores (e.g., pruning). Additionally, the number of cores turned on for training may be less than the number of cores used for inference/classification. A local power manager may determine a power state of each of the cores (e.g., 720) based on a probabilistic approximation.

The 3D ANOC accelerator 800 implements synapses using on-die non-volatile memory (e.g., memory 760). Three-dimensional (3D) stacking of non-volatile memory may be performed to store parameters of large networks to enable an edge-computing platform. Using non-volatile memory to implement the memory 760 involves a tradeoff between performance and energy efficiency (e.g., reduced leakage current). In aspects of the present disclosure, the memory 760 is implemented as non-volatile memory, such as MRAM (magnetoresistive random access memory) and/or RRAM (resistive random access memory).

In contrast to conventional memory, data in MRAM is not stored as an electric charge or a current flow. Rather, data in MRAM is stored by magnetic storage elements. The elements are formed from two ferromagnetic plates. Each ferromagnetic plate holds a magnetization, separated by an insulating layer. One of the two plates is a magnet set to a particular polarity. The other plate's magnetization can be changed to match that of an external field to store memory. RRAM is a type of non-volatile (NV) RAM that changes the resistance across a dielectric solid-state material (e.g., memristor). MRAM is desired in ultra-low power chips because MRAM exhibits reduced current leakage relative to conventional volatile memory (e.g., static random access memory (SRAM)).

Spin-transfer torque magnetic random access memory (STT-MRAM) is an emerging nonvolatile memory that has advantages of non-volatility. In particular, STT-MRAM embedded with logic circuits may operate at a comparable or higher speed than off-chip dynamic random access memory (DRAM). In addition, STT-MRAM has a smaller chip size than embedded static random access memory (eSRAM), virtually unlimited read/write endurance as compared with FLASH, and a low array leakage current. In particular, STT-MRAM is fast and non-volatile, relative to other non-volatile memory options, such as resistive RAM (RRAM), ferroelectric RAM (FRAM), eFlash, and the like.

By contrast, static RAM (SRAM) is prone to leakage. As a result, SRAM is not desirable for implementing the memory 760. In this aspect of the present disclosure, the memory 760 forms part of a hybrid and distributed memory system using non-volatile memory (e.g., STT-MRAM). For example, non-volatile memory with potentially lower write power may be used for training (e.g., RRAM, MRAM). In this example, non-volatile memory with potentially lower read power may be used for inference/classification (e.g., MRAM, phase-change memory (PCM)).

Figure 9:
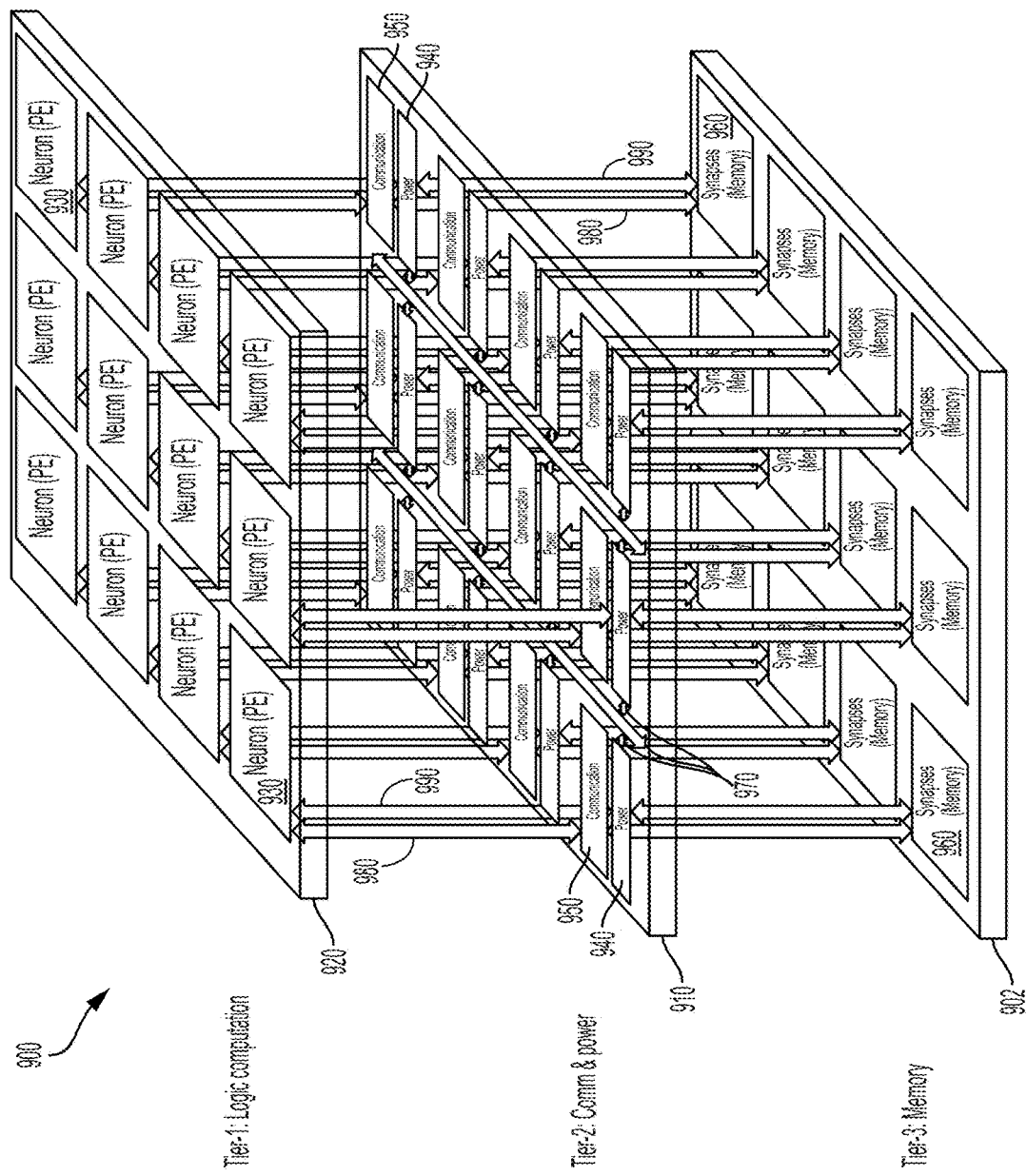
FIG. 9 is a block diagram illustrating a heterogeneous configuration of a three-dimensional (3D) asynchronous network-on-chip (ANOC) ultra-low power neuromorphic accelerator, in accordance with certain aspects of the present disclosure.

FIG. 9 is a block diagram illustrating a heterogeneous configuration of a three-dimensional (3D) asynchronous network-on-chip (ANOC) ultra-low power neuromorphic accelerator 900, in accordance with certain aspects of the present disclosure. In this heterogeneous configuration, the 3D ANOC accelerator 900 includes a logic computation tier 920 stacked on a communications and power tier 910 that is stacked on a memory tier 902 in a 3D stack. Although three tiers of a 3D stack are shown, it should be recognized that fewer or more tiers are contemplated according to aspects of the present disclosure. The maximum number of tiers may be determined according to foundry Z-height limitations.

In contrast to the homogenous configuration shown in FIG. 8, in this heterogeneous configuration, the various tiers may be fabricated using different process nodes. For example, in a non-volatile configuration, memory units 960 of the memory tier 902 may be fabricated using a less advanced process node (e.g., 22 or 28-nanometer (nm)). By contrast, processing elements (PE) 930 of the logic computation tier may be fabricated using an advanced process node (e.g., 7-nanometer (nm)). The communications and power tier 910 may also be fabricated using a less advanced process node (e.g., 40-nanometer (nm)). This flexibility may enable fabrication of the 3D ANOC accelerator 900 at a reduced cost relative to the homogeneous configuration shown in FIG. 8 because the tiers 802 of the 3D ANOC accelerator 800 are fabricated with an advanced process node to support an edge computing platform (e.g., artificial intelligence (AI) on edge).

In this configuration, the memory tier 902 includes the memory units 960, which may be configured as using spin-transfer torque magnetic random access memory (STT-MRAM) due to a low array leakage current to more closely approximate the human brain's power usage (e.g., 20 watts). The memory tier 902 may form a hybrid and distributed non-volatile memory system. For example, non-volatile memory with potentially lower write power may be used for training (e.g., RRAM, MRAM). In this example, non-volatile memory with potentially lower read power may be used for inference/classification (e.g., MRAM, phase-change memory (PCM)) during operation of the 3D ANOC accelerator 900.

The communications and power tier 910 includes local power managers 940 and communications modules 950 that may be paired together. The local power managers 940 may be configured to perform snoops on the processing elements (PEs) 930 for determining a power state of the processing elements (PEs) 930. The snooping may be performed using, for example, handshaking circuitry to communicate across the tiers (e.g., 902, 910, and 920) using the communications modules 950. The communications may be performed across a 3D ANOC communications channel 970, a memory channel 980, and a power channel 990 (or power rail). In one aspect of the present disclosure, the memory tier 902 may be configured to provide adaptive voltage scaling to enable sub-threshold voltage (e.g., 0.2 V to 0.25 V) operation. In this configuration, the memory tier 902 provides smart power management to coordinate each of the local power managers 940 to provide dynamic voltage frequency scaling (DVFS).

Figure 10:
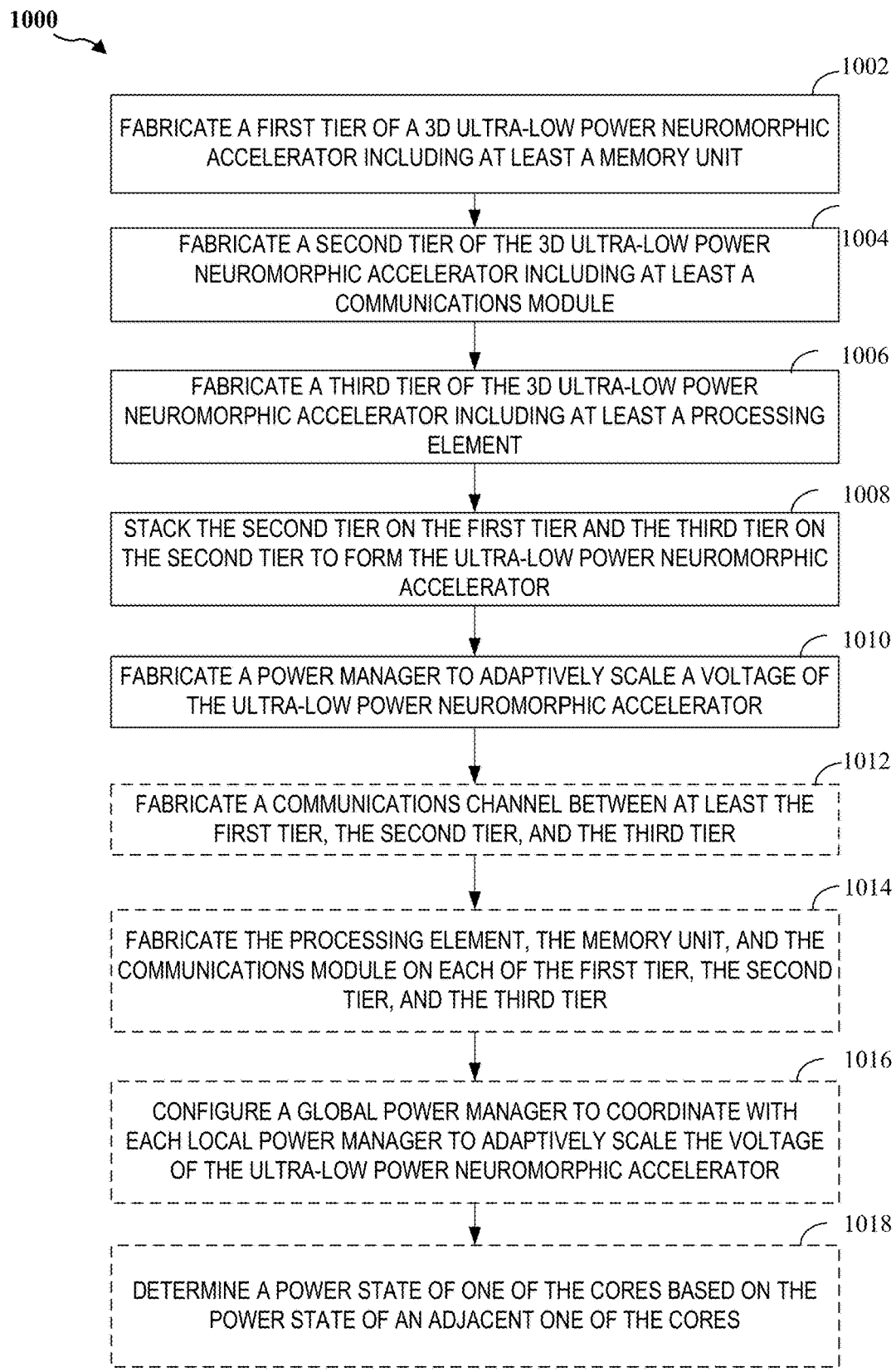
FIG. 10 illustrates a simplified flowchart of a method of fabricating a three-dimensional ultra-low power neuromorphic accelerator, in accordance with certain aspects of the present disclosure.

FIG. 10 depicts a simplified flowchart of a method 1000 of fabricating a three-dimensional ultra-low power neuromorphic accelerator, according to aspects of the present disclosure. At block 1002, a first tier of the 3D ultra-low power neuromorphic accelerator is fabricated to include at least a memory unit. For example, as shown in the homogeneous configuration of FIG. 8, a first tier (e.g., 802-1) may be fabricated to include a memory 760 (e.g., synapse). Alternatively, in the heterogeneous configuration of FIG. 9, a memory tier 902 is fabricated to include memory units 960. At block 1004, a second tier of the 3D ultra-low power neuromorphic accelerator is fabricated to include at least a communications module. For example, as shown in the homogeneous configuration of FIG. 8, a tier (e.g., 802-N) may be fabricated to include the communications module 750. Alternatively, in the heterogeneous configuration of FIG. 9, a communications and power tier 910 is fabricated to include communications modules 950.

Referring again to FIG. 10, at block 1006, a third tier of the 3D ultra-low power neuromorphic accelerator is fabricated to include at least a processing element. For example, as shown in the homogeneous configuration of FIG. 8, a tier (e.g., 802-N) may be fabricated to include the processing elements (PEs) 730 of the multiple cores 720. Alternatively, in the heterogeneous configuration of FIG. 9, a logic computation tier 920 is fabricated to include the processing elements (PEs) 930. At block 1008, the second tier is stacked on the first tier and the third tier is stacked on the second tier to form the ultra-low power neuromorphic accelerator. For example, as shown in FIG. 8, the tiers 802 are stacked to form the 3D ANOC accelerator 800.

At block 1010, a power manager is fabricated to adaptively scale a voltage of the ultra-low power neuromorphic accelerator. For example, as shown in the homogeneous configuration of FIG. 8, a tier (e.g., 802-N) may be fabricated to include the local power manager 740 of the multiple cores 720. Alternatively, in the heterogeneous configuration of FIG. 9, the communications and power tier 910 is fabricated to include local power managers 940 and communications modules 950. Three-dimensional (3D) stacking of the ultra-low power neuromorphic accelerator enables storing of parameters of a neural network to support an edge computing platform. Furthermore, voltage scaling provided by local/global power managers enables ultra-low voltage operation to more closely approximate the human brain.

In an optional configuration, at block 1012 a communications channel is fabricated between the first tier, the second tier, and the third tier. For example, as shown in FIG. 9, a 3D ANOC communications channel 970, a memory channel 980, and a power channel 990 are provided for communication and/or coordination between the memory tier 902, the communications and power tier 910, and the logic computation tier 920. The communications channel enables communication with other ones of the multiples cores (e.g., 920) on a same tier and/or a different tier. In another optional configuration, at block 1014, the processing element, the memory unit, and the communications module are fabricated on each of the first tier, the second tier, and the third tier. For example, as shown in the homogeneous configuration of FIG. 8, each of the tiers 802 (802-1, . . . , 802-N) includes the same configuration of the multiple cores 720 shown in FIG. 7.

In yet another optional configuration, at block 1016, a global power manager is configured to coordinate with each local power manager to adaptively scale the voltage of the ultra-low power neuromorphic accelerator. Furthermore, in another optional configuration, at block 1018, a power state of one of the cores is determined based on the power state of an adjacent one of the cores. This process may be performed to enable dynamic voltage scaling and/or power collapse control for each tier. As described, the first tier, the second tier, and the third tier are different tiers. Furthermore, the first tier, the second tier, and the third tier do not refer to the actual position of the tier. That is, the aforementioned first tier is not limited to the first tier of multiple tiers. Rather, the first tier may be any tier of the multiple tiers. Likewise, the second and third tiers may be any tier of the multiple tiers.

The various operations of methods described above may be performed by any suitable means capable of performing the corresponding functions. The means may include various hardware and/or software component(s) and/or module(s), including, but not limited to, a circuit, an application specific integrated circuit (ASIC), or processor. Generally, where there are operations illustrated in the figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Additionally, "determining" may include receiving (e.g., receiving information), accessing (e.g., accessing data in a memory), and the like. Furthermore, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general-purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, erasable programmable read-only memory (EPROM), electrically erasable programmable read-only memory (EEPROM), registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein include one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a device. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement signal processing functions. For certain aspects, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, random access memory (RAM), flash memory, read only memory (ROM), programmable read-only memory (PROM), erasable programmable read-only memory (EPROM), electrically erasable programmable read-only memory (EEPROM), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the device, all which may be accessed by the processor through the bus interface. Alternatively, or in addition, the machine-readable media, or any portion thereof, may be integrated into the processor, such as the case may be with cache and/or general register files. Although the various components discussed may be described as having a specific location, such as a local component, they may also be configured in various ways, such as certain components being configured as part of a distributed computing system.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may comprise one or more neuromorphic processors for implementing the neuron models and models of neural systems described herein. As another alternative, the processing system may be implemented with an application specific integrated circuit (ASIC) with the processor, the bus interface, the user interface, supporting circuitry, and at least a portion of the machine-readable media integrated into a single chip, or with one or more field programmable gate arrays (FPGAs), programmable logic devices (PLDs), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module. Furthermore, it should be appreciated that aspects of the present disclosure result in improvements to the functioning of the processor, computer, machine, or other system implementing such aspects.

If implemented in software, the functions may be stored or transmitted over as one or more instructions or code on a computer-readable medium. Computer-readable media include both computer storage media and communications media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Additionally, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A three-dimensional (3D) ultra-low power neuromorphic accelerator, comprising:
    a communications and power management tier comprising a plurality of communications modules and a plurality of local power managers;
    a memory tier comprising a plurality of memory units; and
    a logic computation tier comprising a plurality of neural processing units, the logic computation tier coupled to the communications and power management tier and the memory tier, each neural processing unit coupled to one of the plurality of memory units and one of the plurality of the local power managers.

2. The 3D ultra-low power neuromorphic accelerator of claim 1, further comprises a global power manager configured to coordinate the plurality of the local power managers to adaptively scale a voltage of the ultra-low power neuromorphic accelerator.

3. The 3D ultra-low power neuromorphic accelerator of claim 1, in which in which the plurality of memory units comprise a hybrid distributed non-volatile memory, comprising magnetoresistive random access memory (MRAM), resistive random access memory (RRAM), phase-change memory (PCM), or a combination thereof.

* * * * *